United States Patent [19]

Fassbind

[11] 4,013,967

[45] Mar. 22, 1977

[54] MID-PULSE DETECTOR

[75] Inventor: Frank A. Fassbind, Seattle, Wash.

[73] Assignee: The United States of America as represented by the Secretary of the Navy, Washington, D.C.

[22] Filed: Apr. 29, 1976

[21] Appl. No.: 681,317

[52] U.S. Cl. .............................. 329/104; 328/110; 325/320; 178/88; 307/235 E; 328/140

[51] Int. Cl.[2] ......................................... H03K 9/10

[58] Field of Search .......... 328/109, 140, 110, 150; 325/320; 178/67, 88; 329/110, 104; 307/235 E

[56] References Cited

UNITED STATES PATENTS

| | | | |
|---|---|---|---|
| 3,491,305 | 1/1970 | Stone | 325/320 X |
| 3,493,877 | 2/1970 | Jacobson | 329/104 X |
| 3,581,220 | 5/1971 | Bell | 328/140 X |
| 3,684,967 | 8/1972 | Kelly | 328/109 X |
| 3,902,129 | 8/1975 | Boothroyd | 178/88 X |

*Primary Examiner*—John S. Heyman
*Attorney, Agent, or Firm*—Richard S. Sciascia; Ervin F. Johnston; John Stan

[57] ABSTRACT

Apparatus, in a receiver, for detecting the mid-pulse phase reversal of an input signal $s(t) = a(t)_{BLT}\cos(\omega_0 t + \theta_1)$. The signal $a(t)_{BLT}$ is a modulating signal $a(t)$, having a phase-reversal at its midpoint, after bandlimiting by a transmitter, and $\cos(\omega_0 t + \theta_1)$ relates to a carrier having a frequency $f_0$ and phase angle $\theta_1$. The apparatus comprises a hard-limiter, a low-pass filter, threshold detector, a delay timing logic circuit, and a comparator, serving as a zero-crossing detector, whose input is connected to the output of the low-pass filter, which detects the mid-pulse zero-crossing of its input signal. The apparatus further includes an AND gate, whose output comprises a positive-going pulse whose trailing edge represents the mid-pulse of its input signal, and a one-shot, whose output is a sharp pulse representing the mid-pulse of $a(t)$.

1 Claim, 15 Drawing Figures

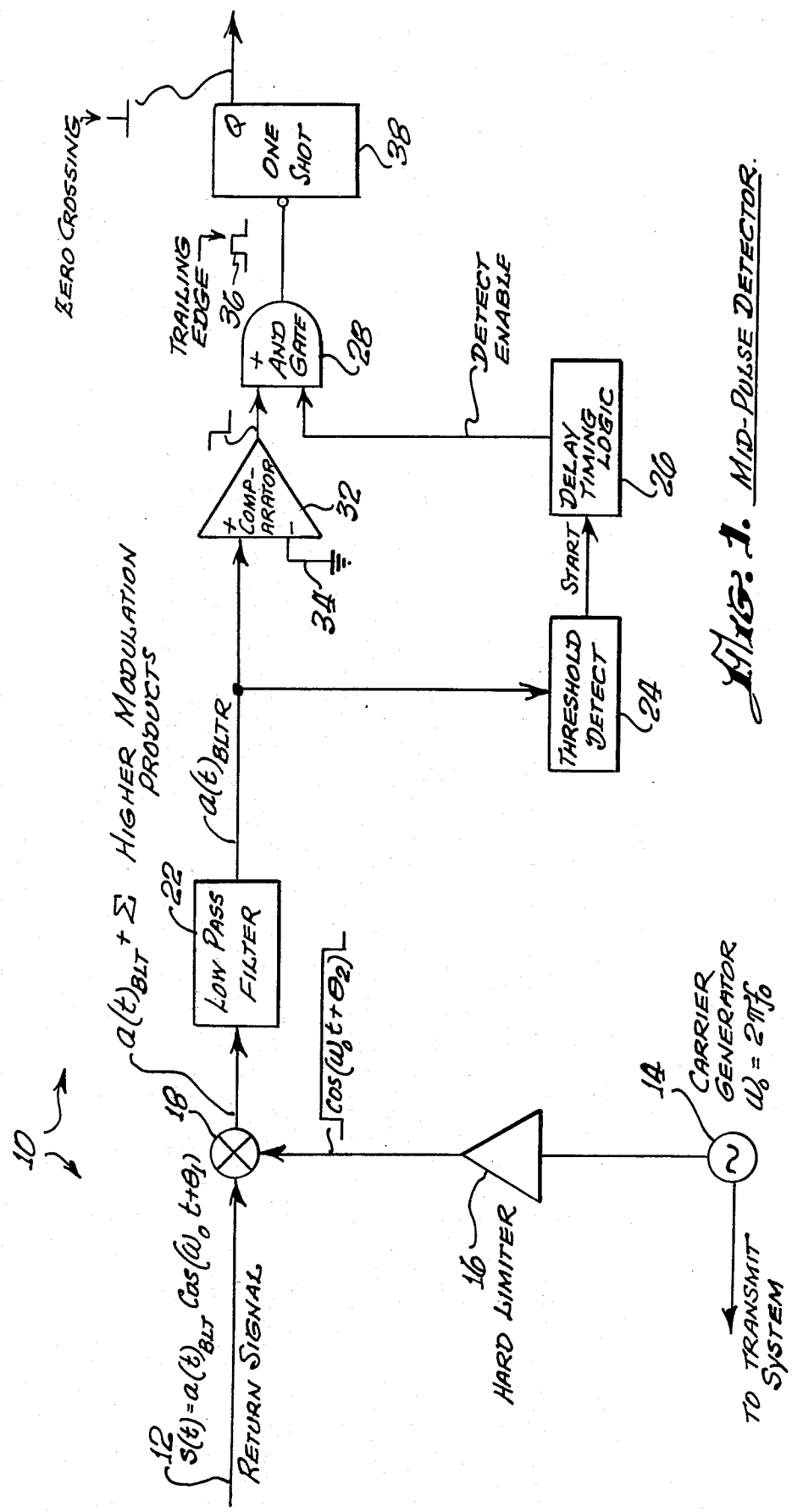

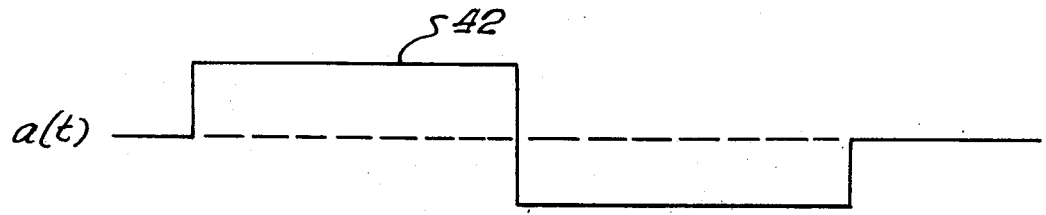
FIG. 2A. MODULATING SIGNAL
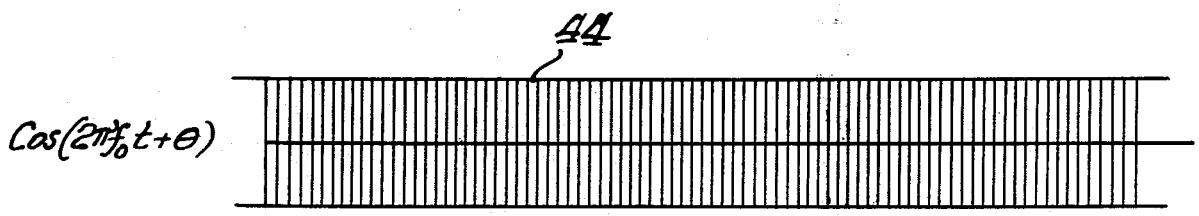
FIG. 2B. CARRIER SIGNAL
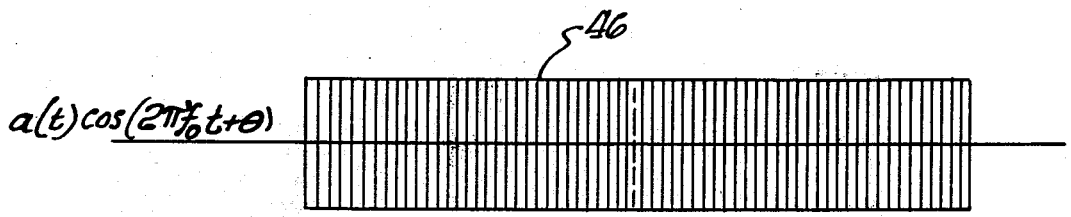
FIG. 2C. THE PRODUCT OF THE MODULATING AND CARRIER SIGNALS.
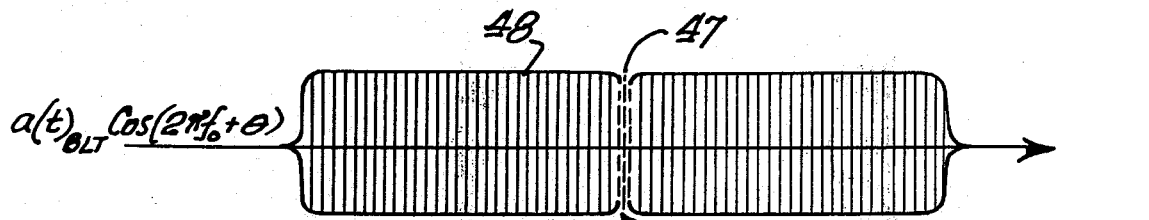
PHASE REVERSAL OF CARRIER.
FIG. 2D. PRODUCT OF THE TWO SIGNALS AFTER BANDLIMITING EFFECTS.
FIG. 2. FORMULATION OF THE TRANSMITTED CARRIER WITH A MID-PULSE PHASE REVERSAL.

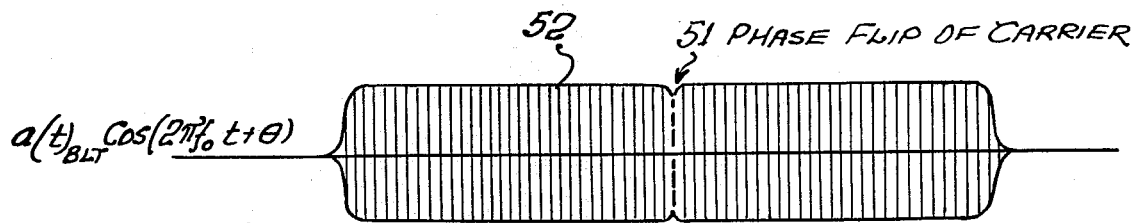

FIG. 3A. PRODUCT SIGNAL (SAME AS FIG. 2D).

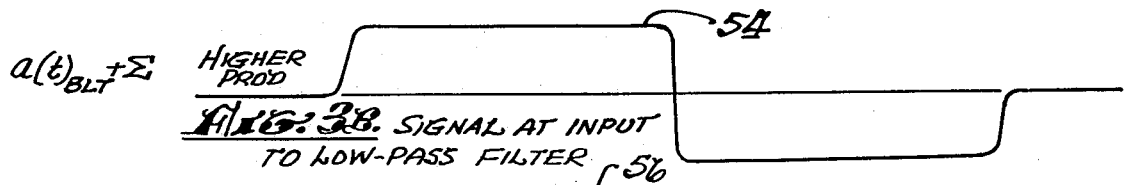

FIG. 3B. SIGNAL AT INPUT TO LOW-PASS FILTER.

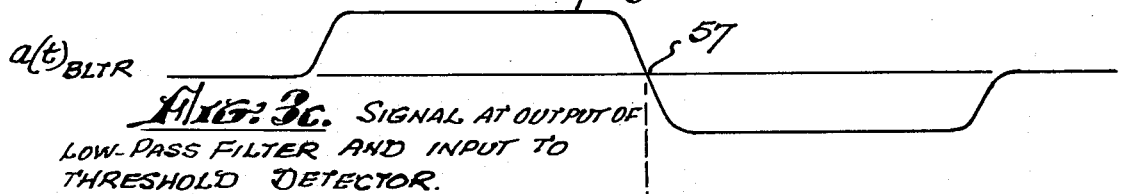

FIG. 3C. SIGNAL AT OUTPUT OF LOW-PASS FILTER AND INPUT TO THRESHOLD DETECTOR.

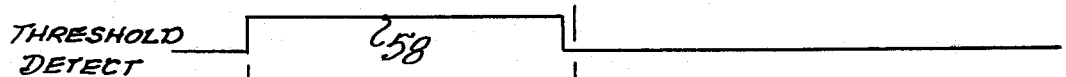

FIG. 3D. SIGNAL AT OUTPUT OF THRESHOLD DETECTOR.

FIG. 3E. DELAY GENERATED BY DELAY TIMING LOGIC.

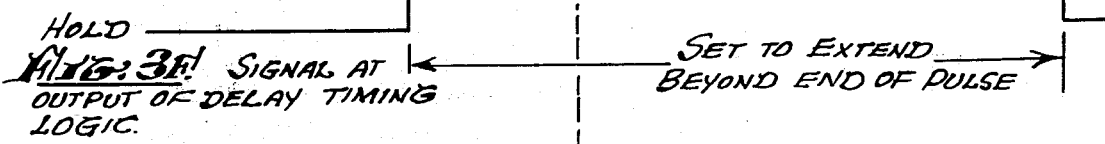

FIG. 3F. SIGNAL AT OUTPUT OF DELAY TIMING LOGIC.

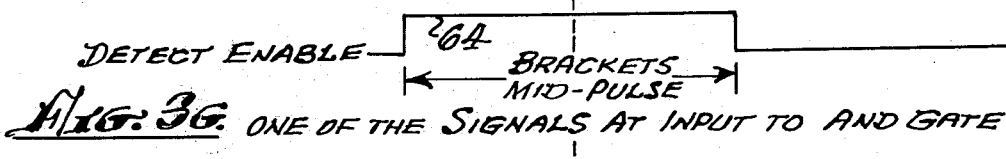

FIG. 3G. ONE OF THE SIGNALS AT INPUT TO AND GATE.

FIG. 3H. OUTPUT OF MID-PULSE DETECTOR.

FIG. 3. WAVEFORMS IN THE RECEIVER FOR THE MID-PULSE DETECTOR.

MID-PULSE DETECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The mid-pulse detector may be used in a receiver to detect the exact time of arrival of a pulse.

The mid-pulse detector operation is based upon the principle that the instantaneous phase reversal of a carrier frequency can be readily detected as a zero-crossing of the amplitude modulation function, or waveform. In more detail, let $a(t)$, represent the desired modulation function and let $\cos 2\pi f_0 t$ represent the carrier. The received modulated carrier, $a(t) \cos (2\pi f_0 t + \theta_1)$, is the product of the two. The finite bandwidth of the signal generator, transmitting system, and the transmission path, introduces finite rise and fall time effects.

In the prior art, leading edge detection has been used to determine pulse arrival time. This method is subject to biased errors, which are a function of signal level relative to detection threshold. The mid-pulse detector of this invention detects a zero-crossing of the modulation function and eliminates this sensitivity to signal amplitude.

Another prior art method of mid-pulse detection is the pulse-differentiation technique. The pulse is first heavily filtered so as to produce a rounded pulse envelope. The differentiation process then produces a zero crossing at the peak of the pulse. This method is sensitive to pulse envelope distortions, which cause the pulse peak to shift relative to the true mid-pulse. Here, again, the phase-locking mid-pulse detector has the advantages of being insensitive to pulse-envelope modulation.

SUMMARY OF THE INVENTION

This invention relates to a mid-pulse detector which detects the instantaneous phase reversal of a carrier frequency $f_0$ by determining the zero crossing of the amplitude-modulation function, $a(t)$. In the presence of an input signal, a reference signal, which is a hard-limited form of the carrier frequency, is multiplied by the input signal to result in a desired modulation function, modified by bandlimiting effects, plus higher modulation products. Subsequent low-pass filtering results in a signal modified by the bandlimiting effects of both the transmit and receive systems. A specific mid-pulse detector actually built was all digital, but an analog detector would also work.

In more detail, this invention relates to an apparatus, in a receiver, for detecting the mid-pulse phase reversal of an input signal $s(t) = a(t)_{BLT} \cos (\omega_0 t + \theta_1)$. The signal $a(t)_{BLT}$ is a modulating signal $a(t)$ after bandlimiting (BL) by a transmitter (T), and $\cos (\omega_0 t + \theta_1)$ relates to a carrier having a frequency $f_0$ and phase angle $\theta_1$.

A hard limiter has its input connected to the output of a carrier generator, which generates the frequency $f_0$. The output of the hard limiter is the signal $\cos (\omega_0 t + \theta_2)$ hard limited.

A multiplier circuit has as its two inputs the input signal $s(t)$ and the output of the hard limiter. The output of the multiplier comprises the signal $a(t)_{BLT}$ plus the sum of higher modulation products.

A low-pass filter, whose input is connected to the output of the multiplier, has as its output $a(t)_{BLTR}$, which is the signal $a(t)$ as modified by the band limiting (BL) effects of the transmitter (T) and receiver (R). The higher modulation products are filtered out by the low-pass filter.

A threshold detector, whose input is connected to the output of the low-pass filter, senses the presence of a received pulse.

A delay timing logic circuit, whose input is connected to the output of the threshold detector delays its output signal.

A comparator, serving as a zero crossing detector, whose input is connected to the output of the low-pass filter, detects the mid-pulse zero crossing of $a(t)_{BLTR}$, and therefore of $a(t)$.

An AND gate, whose inputs are connected to the outputs of the zero crossing detector and of the delay timing logic circuit, has an output which comprises a positive-going pulse whose trailing edge represents the mid-pulse of $a(t)_{BLTR}$.

A one-shot, whose input is connected to the output of the AND gate, has as its output a sharp pulse representing the mid-pulse of $a(t)$.

STATEMENT OF THE OBJECTS OF THE INVENTION

An object of the invention is to provide a phase-locking mid-pulse detector which is insensitive to signal amplitude.

Another object of the invention is to provide a phase-locking mid-pulse detector which is also insensitive to pulse envelope modulation.

Other objects, advantages, and novel features of the invention will become apparent with the following detailed description of the invention, when considered in conjunction with the accompanying drawings.

BRIEF DESCRIPTION OF THE DRAWINGS

FIG. 1 is a block diagram of the mid-pulse detector of this invention.

FIG. 2 is a set of four waves (2a–2d) which show how the transmitted carrier with a mid-pulse phase reversal is formulated.

FIG. 3 is a set of waveforms (3a–3h) of the mid-pulse detector in the receiver.

DESCRIPTION OF THE PREFERRED EMBODIMENTS

Referring now to FIG. 1, this figure shows an apparatus, 10, used generally in a receiver, for detecting the mid-pulse phase reversal of an input signal 12, $s(t) = a(t)_{BLT} \cos (\omega_0 t + \theta_1)$, shown in FIG. 2C. The received signal $a(t)_{BLT}$ is a modulating signal $a(t)$ after bandlimiting (BL) by a transmitter (T), and $\cos (\omega_0 t + \theta_1)$ relates to a carrier having a frequency $f_0$ and phase angle $\theta_1$.

In the system of this invention, the transmitter and receiver are in the same location. Therefore, the operator of the equipment does know what his carrier frequency is, although he does not know the phase $\theta_1$ of the received signal. In another system, not described herein, the precise value of the carrier frequency is not known in advance.

The carrier generator 14 generates a carrier having a frequency $f_0$, which, typically, would be 10 kHz. In the transmitter, not shown, the carrier frequency $f_0$ is modulated by the signal $a(t)$, to result in a signal $a(t)\cos w_0 t$. The received signal, as shown at 12, is $a(t)\cos(w_0 t + \theta_1)$, where $\theta_1$ is the phase angle due to the transmission path. In a typical application, 10 carrier cycles of the returned signal would be picked up.

A hard-limiter 16 has its input connected to the output of the carrier generator 14. Its output is the signal $\cos(w_0 t + \theta_2)$, where $\theta_2$ is the phase delay caused by the transit time of the carrier frequency $f_0$ through the hard limiter 16.

A multiplier circuit 18 has as its two inputs the input signal $s(t)$ at 12 and the output signal $f_0$ of the carrier generator 14. The output of the multiplier 18 comprises the signal $a(t)_{BLT}$ plus the sum of higher modulation products.

A low-pass filter 22 has as its input the output of the multiplier 18. Its output is $a(t)_{BLTR}$, shown in FIG. 3C, which is the signal $a(t)$, shown in FIG. 2A, as modified by the band limiting (BL) effects of the transmitter (T) and receiver (R). The higher modulation products are filtered out by filter 22.

A threshold detector 24, whose input is connected to the output of the low-pass filter 22, senses the presence of pulses above a predetermined threshold level.

One function of the threshold detector 24 is to time subsequent operation by detecting the leading edge of the signal $a(t)_{BLTR}$, 56 in FIG. 3C. This is indicated by the word START at the input to the delay timing logic circuit 26.

A delay timing logic circuit 26 has its input connected to the output of the threshold detector 24. Its purpose is to delay the signal $a(t)_{BLTR}$ before it enters the AND gate 28.

The delay timing logic circuit 26 includes a shift register serving the function of a counter, which has a shift rate, in a typical embodiment, which is 16 times the carrier frequency $f_0$, that is, in the range of 160 kHz. The carrier frequency $f_0$ could be derived from this frequency $16f_0$ by a process involving frequency division.

The shift register counter in the delay timing logic circuit starts counting at the leading edge of $a(t)_{BLTR}$, and keeps feeding pulses into AND gate 28. When one of the pulses coincides with the mid-pulse of $a(t)_{BLTR}$, at a phase match, the AND gate produces an output pulse 36.

The purpose of the delay timing logic circuit 26 is to alert the system 10 to wait a certain length of time until the zero crossing occurs. This is shown in FIG. 3F. In the absence of the threshold detector 24 and the delay timing logic 26, random noise pulses, prior to the internal delay time, could produce an output signal from the AND gate 28 and an output pulse would be generated at the wrong time.

The delay timing logic circuit 26 includes a shift register serving the function of a counter, which has a shift rate, in a typical embodiment, which is 16 times the carrier frequency $f_0$, that is, in the range of 160 kHz. The carrier frequency $f_0$ could be derived from this frequency $16f_0$ by a process involving frequency division.

The shift register counter in the delay timing logic circuit starts counting at the leading edge of $a(t)_{BLTR}$, and keeps feeding pulses into AND gate 28. When one of the pulses coincides with the mid-pulse of $a(t)_{BLTR}$, at a phase match, the AND gate produces an output pulse 36.

A comparator 32, having the function of a zero crossing detector, whose input is connected to the output of the low-pass filter 22, detects the mis-pulse zero crossing of the waveform $a(t)_{BLTR}$, and therefore of the signal $a(t)$, shown in FIGS. 3C and 2A, respectively. The comparator 32 is a zero-crossing detector which compares the voltage of the incoming signal $a(t)_{BLTR}$, shown in FIG. 3C, with ground voltage at lead 34, in FIG. 1.

The AND gate 44, whose inputs are connected to the outputs of the comparator 32 and of the delay timing logic circuit 26, has an output which comprises a positive-going pulse 36 whose trailing edge represents the mid-pulse of $a(t)_{BLTR}$.

A one-shot 38, whose input is connected to the output of the AND gate 28, has an output in the form of a sharp pulse representing the mid-pulse of $a(t)$. As is shown in FIG. 1, the one shot 38 triggers on the trailing edge of its input signal 38.

Discussing now in more detail the theoretical background of the invention, FIG. 1 is a functional diagram of the apparatus 10 for detecting the mid-pulse phase reversal of the received signal. The input signal, $s(t)$, to the mid-pulse detector 10 is $$s(t) = a(t)_{BLT}\cos(2\pi f_0 t + \theta_1), \qquad (1)$$

where $$a(t)_{BLT} = a(t) \text{ modified by} \qquad (2)$$

the band-limiting effects described hereinabove.

Referring now to FIG. 2A, the modulating function $a(t)$ shown therein need not be restricted to the symmetrical waveform shown therein. It may have other symmetrical shapes or even unsymmetrical shapes, the only requirement being that there be a zero crossing, preferably with a 90° slope, at the midpoint of the waveform. It could even be an undulating waveform, as long as there is a sharply defined crossover at the midpoint. A waveform not sharply defined at the crossover point could be sensitive to noise.

An acceptable signal could be a continuous signal which is phase modulated, so long as there is a phase reversal at the midpoint. A waveform 52 similar to one shown in FIG. 2A was one actually used.

The carrier frequency $f_0$ has two zero crossings per cycle, since the phase of the carrier wave is continuous, but only one phase reversal for one cycle of the modulating frequency $a(t)$, 42 in (FIG. 2A), as is shown at 47 of FIG. 2D and 51 of FIG. 3A. In a phase reversal, as the sine wave, represented by the carrier frequency, decreases to a magnitude of zero at 180°, instead of assuming increasingly negative values beyond 180°, the wave does not cross the zero magnitude line, but instead assumes increasingly positive values.

The timing signals in FIG. 3 shows how the threshold detector 24 senses the presence of a received pulse. The signal "Detect Enable," 64 in FIG. 3G, one of the inputs to AND gate 28, brackets the zero-crossing period, as shown, and is used as an output enabling signal to reduce the probability of a spurious detection.

Obviously, many modifications and variations of the present invention are possible in the light of the above teachings, It is therefore to be understood that, within the scope of the appended claims, the invention may be practiced otherwise than as specifically described.

What is claimed is:

1. Apparatus, in a receiver, for detecting the mid-pulse phase reversal of an input signal $s(t) = a(t)_{BLT} \cos(\omega_0 t + \theta_1)$, where the signal $a(t)_{BLT}$ is a modulating signal $a(t)$ after band-limiting by a transmitter and $\cos(\omega_0 t + \theta_1)$ relates to a carrier having a frequency $f_0$, comprising:

means for generating a signal having a frequency of $f_0$;

a hard-limiter whose input is connected to the signal generating means, and whose output is the signal $\sin(\omega_0 t + \theta_2)$ hard limited, and $\theta_2$ is the phase change due to the hard limiting;

a multiplier circuit, whose two inputs are connected to the input signal $s(t)$ and the output of the hard limiter, the output of the multiplier comprising the signal $a(t)_{BLT}$ plus the sum of higher modulation products;

a low-pass filter, whose input is connected to the output of the multiplier and whose output is $a(t)_{BLTR}$, which is the signal $a(t)$ as modified by the band limiting effects of the transmitter and receiver, the higher modulation products being filtered out by the low-pass filter;

a threshold detector, whose input is connected to the output of the low-pass filter, which senses the presence of a received pulse;

a delay timing logic circuit, whose input is connected to the output of the threshold detector, for delaying its output signal with respect to its input signal;

a comparator, serving the function of a zero crossing detector, whose input is connected to the output of the low-pass filter, which detects the mid-pulse zero crossing of a $a(t)_{BLTR}$, and therefore of $a(t)$;

an AND gate, whose inputs are connected to the outputs of the comparator and of the delay timing logic circuit, and whose output comprises a positive-going pulse whose trailing edge represents the mid-pulse of $a(t)_{BLTR}$; and a one-shot, whose input is connected to the output of the AND gate, and whose output is a sharp pulse representing the mid-pulse of $a(t)$.

* * * * *